United States Patent
Haimi-Cohen et al.

(10) Patent No.: US 10,397,515 B2
(45) Date of Patent: Aug. 27, 2019

(54) PROTECTING PERSONAL PRIVACY IN A VIDEO MONITORING SYSTEM

(71) Applicant: Alcatel-Lucent USA Inc., Murray Hill, NJ (US)

(72) Inventors: Raziel Haimi-Cohen, Springfield, NJ (US); Xin Yuan, New Providence, NJ (US); Paul A. Wilford, Bernardville, NJ (US)

(73) Assignee: Nokia of America Corporation, Murray Hill, NJ (US)

( * ) Notice: Subject to any disclaimer, the term of this patent is extended or adjusted under 35 U.S.C. 154(b) by 93 days.

(21) Appl. No.: 15/398,984

(22) Filed: Jan. 5, 2017

(65) Prior Publication Data

US 2018/0191992 A1 Jul. 5, 2018

(51) Int. Cl.
  *H03M 7/30* (2006.01)
  *H04N 7/18* (2006.01)
  *H04N 5/915* (2006.01)
  *H04N 5/917* (2006.01)

(52) U.S. Cl.
  CPC .......... *H04N 5/917* (2013.01); *H03M 7/3062* (2013.01); *H04N 5/915* (2013.01); *H04N 7/18* (2013.01); *H04N 7/183* (2013.01)

(58) Field of Classification Search
  CPC .................................................... H04N 5/917
  See application file for complete search history.

(56) References Cited

U.S. PATENT DOCUMENTS

| | | | |
|---|---|---|---|
| 6,195,732 B1* | 2/2001 | Adams | G06F 21/805 711/156 |
| 8,863,044 B1* | 10/2014 | Casati | G06F 17/5072 716/106 |
| 2013/0010859 A1* | 1/2013 | Schwaab | H04N 19/147 375/240.03 |
| 2014/0043491 A1 | 2/2014 | Jiang et al. | |
| 2015/0178944 A1 | 6/2015 | Haimi-Cohen | |
| 2015/0178945 A1 | 6/2015 | Haimi-Cohen | |
| 2015/0382026 A1* | 12/2015 | Jiang | H04N 19/169 375/240.02 |
| 2016/0021390 A1 | 1/2016 | Haimi-Cohen | |

(Continued)

OTHER PUBLICATIONS

Haimi-Cohen, et al. "Compressive measurements generated by structurally random matrices: Asymptotic normality and quantization", Signal Processing 120, Mar. 31, 2006, 17 pages.

(Continued)

*Primary Examiner* — Tracy Y. Li

(57) ABSTRACT

An image acquisition device compresses a media signal representative of a scene based on a sensing matrix that is a determined by a sensing matrix template and a set of template parameters. The image acquisition device provides the compressed media signal to a receiver and selectively provides a specification of a subset of the set of template parameters to the receiver. The receiver extracts one or more scene descriptors representative of one or more portions of the scene from the compressed media signal using the sensing matrix template without knowledge of the template parameters that are not included in the subset. The template parameters that are not included in the subset are not received by the receiver.

14 Claims, 7 Drawing Sheets

(56) References Cited

U.S. PATENT DOCUMENTS

2017/0169293 A1* 6/2017 Valsesia ............ G06K 9/00577

OTHER PUBLICATIONS

Romberg, Justin. "Compressive sensing by random convolution." SIAM Journal on Imaging Sciences 2, No. 4, Nov. 4, 2009, 22 pages.

International Search Report and Written Opinion dated Jun. 29, 2018 for PCT/US18/012143, 11 pages.

* cited by examiner

PROTECTING PERSONAL PRIVACY IN A VIDEO MONITORING SYSTEM

BACKGROUND

Description of the Related Art

Networks of surveillance cameras have been installed to monitor people and objects in public and private places. The images collected by the surveillance cameras serve a wide array of purposes, including ensuring the safety and security of the people in these spaces, getting immediate information about congestion and occupancy of various facilities, determining when maintenance is necessary, and the like. Many people feel that surveillance cameras are an unwelcome invasion of their personal privacy. People under surveillance may object to being captured on video by the surveillance cameras and may be uncomfortable with the awareness that video images of them are in the possession of unknown people. For example, many people object to being filmed while relaxing at swimming pools or when they are patients in a hospital, particularly when there is nothing improper in their behavior.

One approach to balancing the benefits of monitoring public or private spaces using surveillance cameras and respecting the privacy of the people in those spaces is to discard the video images after extracting information characterizing the spaces from the video images. However, hackers may still be able to steal the full video images before the video images are discarded. Furthermore, the public interest in the full video images can override privacy concerns in some situations, e.g., in the case of emergencies or if there is a legal obligation to provide the video image. Privacy concerns can also be addressed by posting signage that indicates that an area is under surveillance (which frequently increases visitors' awareness of surveillance and consequently increases their discomfort), storing the video images in (hopefully) secure databases, or simply turning off the surveillance cameras when requested (which may create a security vulnerability).

BRIEF DESCRIPTION OF THE DRAWINGS

The present disclosure is better understood, and its numerous features and advantages made apparent to those skilled in the art by referencing the accompanying drawings. The use of the same reference symbols in different drawings indicates similar or identical items.

DETAILED DESCRIPTION

Figure 1:
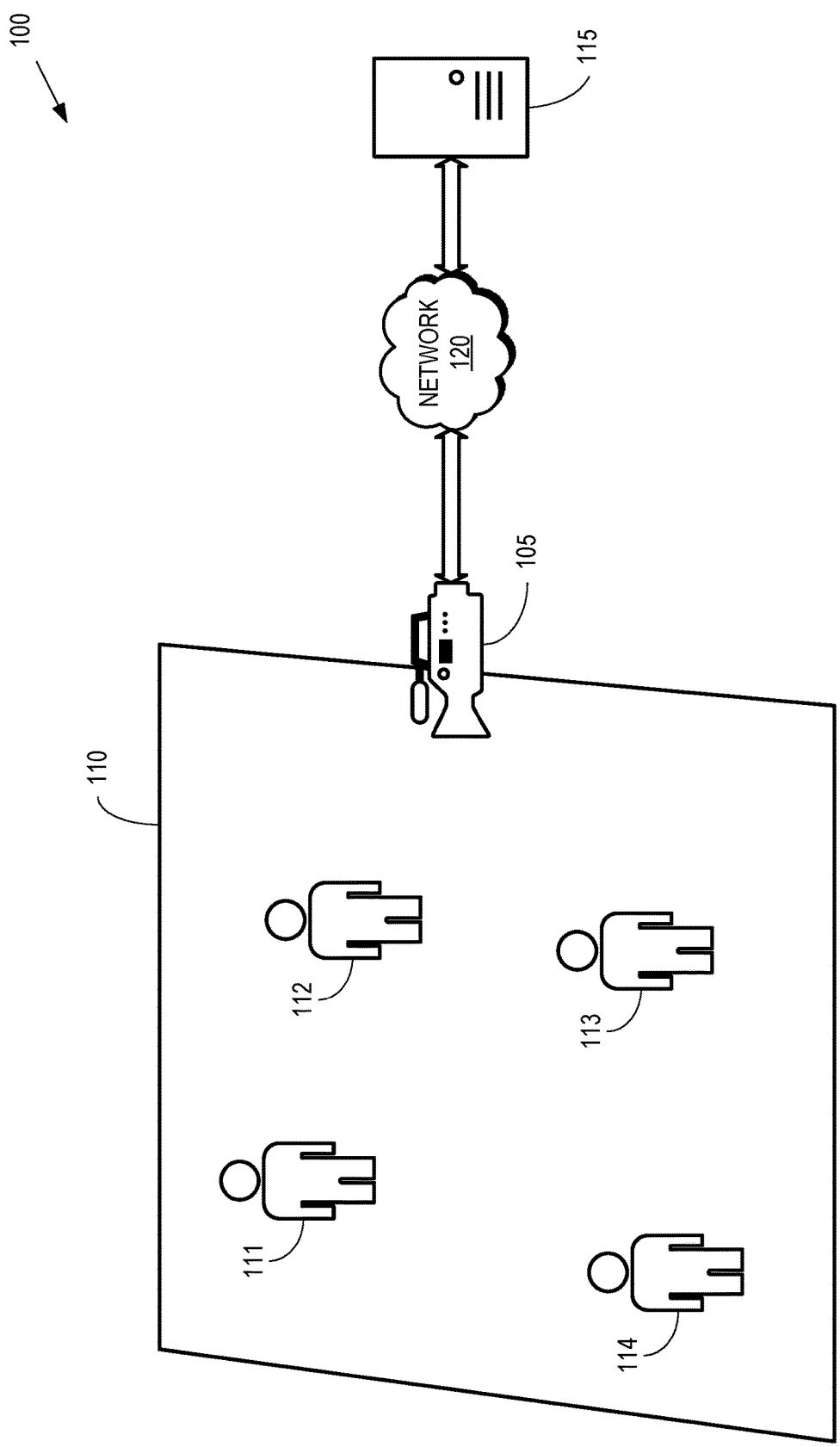
FIG. 1 is a diagram of a first example of an image acquisition system according to some embodiments.

The benefits of video surveillance of public or private spaces can be retained while respecting the privacy of the people in those spaces by compressing video signals based on a sensing matrix. As used herein, the term "sensing matrix" refers to a matrix that is defined by a sensing matrix template and a set of template parameters. The sensing matrix template is a formula or a rule for constructing the sensing matrix according to a set of arguments or variables that are determined by the set of template parameters. The sensing matrix template is resolved into a uniquely defined sensing matrix by setting each of the variables in the sensing matrix template to a value of a corresponding parameter from the set of template parameters. Operations can then be performed on the resolved matrices. Some embodiments of the sensing matrix template require an empty set of parameters to be resolved, and thus these embodiments of the sensing matrix template are, in fact, fully specified sensing matrices. In some embodiments, the sensing matrix is not explicitly constructed from the sensing matrix template and the set of parameters. However, in these embodiments, operations are performed (without explicitly generating the sensing matrix) that are functionally equivalent to operations that are performed using the sensing matrix, for example, computing the product of the sensing matrix and a vector. These operations require having a full specification of the matrix, which is equivalent to knowing both the sensing matrix template and the set of template parameters.

An estimate of the original video signal can be reconstructed from the compressed video if the sensing matrix is fully specified, i.e. if both the sensing matrix template and the template parameters are known. If the sensing matrix template is known, but the set of template parameters is not fully known, it is practically impossible to reconstruct an estimate of the original video signal, but it is possible to determine scene descriptors that represent properties of the incoming video signals, for example, scene descriptors that indicate speeds and directions of motions of objects in the video signals can be determined from the compressed video signals using the sensing matrix template, but without knowledge of the template parameters, e.g., without using or without access to the template parameters. These scene descriptors provide enough information for the surveillance task to be conducted successfully, but do not provide information that could compromise the privacy of the people in the video. Thus, privacy of individuals can be protected while performing surveillance by selectively providing a specification of the template parameters (such as random number generator seeds) to receivers that are able to extract scene descriptors based on the selectively provided specification, but are not able to decompress the compressed video signals based on the selectively provided specification, as discussed herein. The selectively provided specification can include a subset of the template parameters.

Some embodiments of the set of template parameters are sequences of pseudo-random numbers that are generated by one or more random number generators. In this case, each sequence of pseudo-random numbers is completely specified by a seed of the corresponding number generator and the template parameters are reduced to a list of random number generator seeds. For example, if there is one random number generator and one seed, the set of template parameters is reduced to a single parameter, the random number generator seed, which completely specifies the whole set of template parameters.

Some embodiments of the sensing matrix template are a product of a first random matrix and a second matrix. The first random matrix is generated based on a first matrix template and a first random number generator seed that produces a sequence of random numbers to fill the first matrix template. The second matrix is a fully specified matrix. The first random matrix and the second matrix are chosen so that scene descriptors that represent properties of the incoming video signals can be determined from the compressed video signals using the second matrix and knowledge of the first matrix template, but without knowledge of the first random number generator seed, e.g., without using or without access to the first random number generator seed. The incoming video itself can be reconstructed if, and only if, the random number generator is known, and therefore the sensing matrix is uniquely determined. Thus, selectively providing a subset of the template parameters includes providing a subset of the template parameters that does not include providing the first random number generator seed.

The video signals can be derived from the compressed video signals using the first random matrix and the second matrix. Some embodiments of the second matrix are second random matrices that are generated based on second random number generator seeds that are not necessarily equal to the first random number generator seed. Privacy can be insured by providing the compressed video signals to a receiver without the first random number generator seed. The second matrix should be known to the receiver. For example, if the second matrix is a second random matrix defined by a second random number generator seed, the second random number generator seed can be provided to the receiver. The receiver can then resolve the second matrix and extract the scene descriptors from the compressed video signals using the second matrix and knowledge of a first matrix template used to define the first matrix. Without access to the first random number generator seed, the receiver is not able to generate the first matrix and is therefore unable to re-create the video signal from the compressed video signal. In some cases, such as emergencies or under legal obligation, the first random number generator seed can be provided to the receiver so that the receiver can generate the first random matrix from the first random number generator seed. The receiver can then recover the video signals from the compressed video signals using the first random matrix and the second matrix. In some embodiments, the random number generator seeds are provided to the receiver in an encrypted form and then the encryption keys for the encrypted seeds are selectively provided based on whether or not there is an anomaly that requires reconstructing the video signals from the compressed video signal. For example, if an anomaly is detected and the receiver is required to reconstruct the video signals, the random number generator seeds or encryption keys are selectively provided to the receiver.

Video surveillance is the most ubiquitous form of surveillance and therefore poses a significant challenge to balance the demands for accurate video surveillance while also respecting privacy. However, surveillance using other modalities such as still images, sound, infrared imaging, and the like are also likely to raise similar privacy issues. In the interest of clarity, embodiments of the techniques disclosed herein are described in the context of video surveillance. However, some embodiments of the techniques disclosed herein are applicable to balancing the demands for accurate surveillance and privacy during surveillance using other signal modalities. Thus, the term "media signal" is used herein to refer generally to signals that can be used for surveillance including video signals, still images, audio signals, infrared imaging, and the like. Furthermore, although embodiments of the sensing matrices described herein are defined by a sensing matrix template and a parameter set that consists of a single parameter such as a random number generator seed, some embodiments of the sensing matrices are defined using other sensing matrix templates or other sets of parameters. Similarly, embodiments of the scene descriptors disclosed herein are motion descriptors, other embodiments utilize other types of scene descriptors, for example, object descriptors that represent objects in the video signals.

FIG. 1 is a diagram of a first example of an image acquisition system 100 according to some embodiments. The image acquisition system 100 includes an image acquisition device 105 that is used to monitor a region 110. Some embodiments of the image acquisition device 105 include a video camera that is used to capture video images or other media signals representative of the region 110, which can be at any location including public places such as a street corner, a plaza, or a swimming pool and private places such as a conference room, a store, a hospital room, and the like. One or more people 111, 112, 113, 114 (collectively referred to herein as "the people 111-114") are present in the region 110. As discussed herein, the people 111-114 in the region 110 that is being monitored or surveilled by the image acquisition device 105 may object to having their likenesses captured on video by the image acquisition device 105 and may be uncomfortable with the awareness that video images of them are in the possession of unknown people.

At least in part to respect the privacy of the people 111-114, the image acquisition device 105 performs compressive sensing of the region 110 on the basis of a sensing matrix. Some embodiments of the image acquisition device 105 capture pixels of the image as a matrix of numbers or, if the image acquisition device 105 is configured to capture color images, a plurality of matrices representing a corresponding plurality of color components. The pixels of the image are organized as a pixel vector (i.e. a one-dimensional array or a finite sequence of numbers), typically by ordering the pixels in the matrix column by column. The pixel vector is multiplied by the sensing matrix to produce a measurements vector, which is typically of a much lower dimension than the pixel vector. The measurements vector is then transmitted to the receiver 115. For example, the measurements vector can be transmitted from the image acquisition device 105 to the receiver 115 over a network 120. In other embodiments, such as when the image acquisition device 105 implements a lensless camera, the light arriving at the image acquisition device 105 is manipulated to produce an optical signal that is sampled to produce a measurements vector. In this case, the operation of multiplying the pixel vector by a sensing matrix is performed in the electro-optical domain, and although no pixels are captured explicitly, the operation is functionally equivalent to that of the former, digital method.

As discussed herein, some embodiments of the image acquisition device 105 are configured to capture video signals that are representative of the region 110. Video signals can be viewed as a sequence of images, each referred to as a frame. Some embodiments of the image acquisition device 105 process each frame separately, by applying a sensing matrix to that frame and producing a measurements vector. In other embodiments, the image acquisition device 105 divides the video into "blocks" and the sensing matrix is applied to each block. As used herein, the term "block" refers to a spatio-temporal region in the video stream. The pixels of the block are organized as a pixel vector. For example, a block can be a fixed rectangular region in several consecutive frames, and the pixel vector is constructed by first concatenating the columns of the region in each frame and then concatenating the resulting vectors of the frames in the block. As is the case with a single image, once a pixel vector is constructed, it is multiplied by the sensing matrix to produce a measurements vector that is transmitted to the receiver 115, and as is the case with a single image, the operation of multiplying the pixel vector by the sensing matrix can be implemented in the electro optical domain, without ever generating the pixel vector explicitly. Examples of compressive sensing of video signals are disclosed in U.S. Patent Application Publication No. 20160021390, which is incorporated herein by reference in its entirety, and U.S. Patent Application Publication No. 20160249065, which is incorporated herein by reference in its entirety.

Some embodiments of the image acquisition device 105 compress an acquired image or video signal representative of the region 110 based on a sensing matrix that is a product of a first random matrix and a second matrix. As used herein, the term "random matrix" refers to a matrix that is defined by a template that depends on a sequence of random variables. The template is resolved into a particular instance of the random matrix by generating values for each of the random variables in the sequence. For example, a random number generator can generate a sequence of pseudo-random numbers that are used to populate the sequence of random variables. Thus, specifying the seed of the random number generator completely determines the random matrix. In some embodiments, the sequence of random variables directly specifies some or all of the entries of the random matrix. However, as discussed herein, other embodiments of the sequence may be parameters of an operation that is applied to a known matrix to produce the random matrix. Entities that have access to the random number generator seed are able to generate the random matrix and entities that do not have access to the random number seed are not able to generate the random matrix, even though the entity knows the template for the random matrix.

To generate a sensing matrix, the first random matrix is generated by populating a first matrix template with random numbers generated based on a first random number generator seed. For example, the image acquisition device 105 can generate the first matrix using a first random number generator seed that is stored in the image acquisition device 105 or provided to the image acquisition device 105 by a secure server (not shown in FIG. 1). In some embodiments, the second matrix is also a random matrix that is generated by populating a second matrix template with random numbers generated based on a second random number generator seed. The acquired video signal cannot be reconstructed from compressed video signal without knowledge of the first random number generator seed, e.g., without using or without access to the first random number generator seed. Thus, the image acquisition system 100 is able to protect the privacy of the people 111-114 by selectively distributing the first random number generator seeds so that the acquired video signal cannot be reconstructed from the compressed video signal except in anomalous cases such as emergencies or under legal obligation. For example, a subset of template parameters that does not include the first random number generator seeds can be selectively distributed to protect privacy of the people 111-114.

The image acquisition system 100 also includes one or more receivers 115 that are configured to receive the compressed video signal from the image acquisition device 105. Some embodiments of the receiver 115 are configured to extract scene descriptors from the compressed video signal. Examples of scene descriptors include motion descriptors that indicate that there is a moving object at a certain location in scene of the region 110 captured by the image acquisition device 105. The motion descriptors can also characterize a velocity and a direction of motion of the object. Screen descriptors can also include object descriptors that indicate the presence of specific objects in the scene of the region 110.

The receiver 115 is able to extract the scene descriptors from the compressed video signal without reconstructing the original acquired video signal. The following discloses an example of a process for extracting scene descriptors from a compressed video signal. First, an example of a technique for detecting motion that can be utilized when the pixels of the original video are available is discussed to provide a reference. Second, some embodiments of techniques for extracting the same information from the measurements vector, which is contained in the compressed video signal, are disclosed. Consider a video block of size V×H×T that is captured by the image acquisition device 105, where T is the number of frames in the block, and in each frame the block contains a rectangle of size V×H of pixels, where V and H are the vertical and horizontal dimensions of the rectangle, respectively. Let $X_{v,h,t}$, $0 \le t < T$, $0 \le h < H$, $0 \le t < T$ be the pixels in the block X and let $x = [x_0, \ldots, x_{N-1}]^T$ be an N-dimensional pixel vector, N=VHT, whose entries are the pixels of the block, organized column by column and frame by frame:

$$x = [X_{0,0,0}, \ldots, X_{V-1,0,0}, \ldots, X_{0,1,0}, \ldots, X_{V-1,1,0}, \ldots, X_{V-1,H-1,0}, \ldots, X_{0,0,1}, \ldots, X_{V-1,H-1,1}, \ldots, X_{V-1,H-1,T-1}]^T \quad (1)$$

In other words, each three dimensional pixel index (v,h,t), $0 \le t < T$, $0 \le h < H$, $0 \le t < T$ is mapped to the one dimensional index $0 \le n < N$ of x according to $$n = v + Vh + VHt \quad (2)$$

In the interest of clarity, the video signal is assumed to be monochrome, with pixel values between 0 and 1. Persons of ordinary skill in the art should be able to modify the following discussion to include processing of color video signals. Let $$\langle u \rangle_k = u \bmod(k)$$

denote the remainder when dividing u by k. Let $\mathcal{T}^n x$ denote the signal x circularly shifted by n:

$$\mathcal{T}^n = [x_n, x_{n+1}, \ldots, x_{N-1}, x_0, \ldots, x_{n-1}]^T$$

That is, the entries of $\mathcal{T}^n x$ are defined by $$[\mathcal{T}^n x]_j = x_{\langle n+j \rangle_N}$$

If $0 \le j < N$ is an index, we define $$\mathcal{T}^n(j) = \langle n+j \rangle_N,$$

hence $$\mathcal{T}^n x = [x_{\mathcal{T}^n(0)}, \ldots, x_{\mathcal{T}^n(N-1)}]^T$$

In a similar way, one can define a 3-dimensional circular shift on the block X, by shifting along each dimension separately. If the shift is by k,l,m along the vertical, horizontal and temporal dimensions, then the entries of the shifted block are defined by $$[\mathcal{T}^{(k,l,m)}X]_{v,h,t} = x_{\langle k+v\rangle_V, \langle l+h\rangle_H, \langle m+t\rangle_T}$$

Considering (2), it is clear that each 3-dimensional circular shift of X corresponds to a 1-dimensional shift of the pixel vector x. In other words, if a pixel vector is created out of the shifted block $\mathcal{T}^{(k,l,m)}X$ using (1), with the entries of X replaced by entries of $\mathcal{T}^{(k,l,m)}X$, it will be of the form $\mathcal{T}^n x$ where $$n + Vl + VHm. \quad (3)$$

If the block contains no motion, each frame is similar to the one preceding it, hence $\mathcal{T}^{(0,0,1)}X$ is similar to X. On the other hand, if there is motion in the block, the moving objects at each frame appear at different position, and their speed can therefore be measured in units of pixels per frame. If the block contains moving objects at a speed of k pixels vertically and l pixels horizontally, then each frame in the block is similar to the next frame shifted by k and l pixels vertically and horizontally, respectively, hence $\mathcal{T}^{(k,l,1)}X$ is similar to X. The issues of wrap-around can be handled by zero-padding and windowing, as explained in more detail in US Patent Application Publication No. 2015/0178944, which is incorporated herein by reference in its entirety. Therefore, if X is available, a motion in the block can be detected and its speed and directions can be determined, using the following steps:

A. For each pair (k,l) which corresponds to feasible motion, compute the similarity of $\mathcal{T}^{(k,l,1)}X$ and X.

B. Let (k*,l*) be the pair at which the similarity is maximal. If the similarity for this pair exceeds some threshold, conclude that there is motion in the video, and its speed components are k* and l* pixels per frame in the vertical and horizontal directions, respectively.

Since Eq. (3) establishes a one-to-one correspondence between the 3-dimensional shifts on the block X and 1-dimensional shifts on the pixel vector x, these steps could be performed on the pixel vectors, rather than on the pixel blocks. To be more concrete, let $\mathcal{N}$ be the set of all shifts n of x that correspond to possible motions, that is, motions that are deemed feasible, in terms of direction and speed, in the scene of the region 110 being monitored by the image acquisition device 105. Let $$u = \mathcal{G}(x) \quad (4)$$

be a vector of features extracted from the pixel vector using a feature extraction operator $\mathcal{G}$. Similarly let $$u^{(n)} = \mathcal{G}(\mathcal{T}^n x) \quad (5)$$

be the corresponding feature vector extracted from the shifted vector $\mathcal{T}^n x$. Let $dist(u^{(n)}, u)$ be a measure of the distance between u and $u^{(n)}$. Then the steps above are equivalently done by finding $$n^* = \operatorname{argmin}_n dist(u^{(n)}, u) = \operatorname{argmin}_n dist(\mathcal{G}(\mathcal{T}^n x), \mathcal{G}(x)) \quad (6)$$

$$d^* = dist(u^{(n^*)}, u) = dist(\mathcal{G}(\mathcal{T}^{n^*} x), \mathcal{G}(x)) \quad (7)$$

and, if d* is less than a threshold, convert the 1-dimension shift n* into a 3-dimension shift on the block, (k*,l*,m*) and conclude that there is motion in the block, and its vertical and horizontal components are k*/m*, l*/m* pixel per frame, respectively.

A measurements vector is given by $$y = \Phi x \quad (8)$$

where $\Phi$ is a M×N matrix that is referred to as the sensing matrix and y is the M-dimensional measurements vector, where M≤N and usually M⊏N. For a well-designed sensing matrix, compressive sensing theory provides methods to estimate x given y and $\Phi$. However, while obtaining the measurements vector according to (8) is a low complexity operation, the reconstruction of an estimate of the original signal given y and t can be quite complex, but in principle, if y and t had been known, the receiver 115 could reconstruct x and then use Eqs. (6) and (7) to determine if there is any motion in the block, and if there is, calculate its velocity components. However, this approach is not possible if t is not fully known to the receiver 115, as is the case in the embodiments which we consider now. In these embodiments, the receiver 115 substitutes u, $u^{(n)}$, $n \in \mathcal{N}$ by the vectors $\hat{u}$, $\hat{u}^{(n)}$, $n \in \mathcal{N}$, respectively, which are extracted from the measurements vector, $$\hat{u} = \tilde{\mathcal{G}}(y) \quad (9)$$

$$\hat{u}^{(n)} = \tilde{\mathcal{G}}^n(y) \quad (10)$$

using the feature extraction operators $\tilde{\mathcal{G}}$, $\tilde{\mathcal{G}}^{(n)}$, $n \in \mathcal{N}$, and a corresponding distance function $\overline{d}ist(\hat{u}^{(n)}, \hat{u})$. The vectors $\hat{u}$, $\hat{u}^{(n)}$, $n \in \mathcal{N}$ and the distance list satisfy the condition:

$$\overline{d}ist(\hat{u}^{(n)}, \hat{u}) \approx dist(u^{(n)}, u) n \in \mathcal{N} \quad (11)$$

In some embodiments, the vectors $\hat{u}$, $\hat{u}^{(n)}$ are estimates of u, $u^{(n)}$, $n \in \mathcal{N}$, respectively, but they do not have to be. In fact they do not even have to be of the same dimension. All that is necessary is an approximation of the distances, as shown in (11). The receiver 115 replaces equations (6), (7) by $$\hat{n}^* = \operatorname{arg\,min}_{n \in \mathcal{N}} \overline{d}ist(\hat{u}^{(n)}, \hat{u}) = \operatorname{arg\,min}_{n \in \mathcal{N}} \overline{d}ist(\tilde{\mathcal{G}}^n(y), \tilde{\mathcal{G}}(y)) \quad (12)$$

$$\hat{d}^* = \overline{d}ist(\hat{u}^{(n^*)}, \hat{u}) = \min_{n \in \mathcal{N}} \overline{d}ist(\tilde{\mathcal{G}}^n(y), \tilde{\mathcal{G}}(y)) \quad (13)$$

and estimates the motion using $\hat{n}^*$, $\hat{d}^*$ instead of n*, d*, respectively. Having the approximate operators $\tilde{\mathcal{G}}$, $\tilde{\mathcal{G}}^n$ is key for this processing. Such an operator does not exist in general, but it exists for specific types of sensing matrices. Computation of motion descriptors is described in further detail in U.S. Patent Application Publication No. 2015/0178944, which is incorporated herein by reference in its entirety, and U.S. Patent Application Publication No. 2015/0178945, which is incorporated herein by reference in its entirety.

As discussed herein, the first random matrix and the second matrix are constructed so that the receiver 115 can extract motion descriptors from the compressed video signal without knowledge of the first random number generator seed that is used to populate the entries in the first random matrix. However, the receiver 115 is not able to reconstruct the video signal from the compressed video signal unless the receiver 115 has complete knowledge of both the first random matrix and the second matrix, e.g., using the first random number generator seed. Thus, privacy of the people 111-114 can be insured by not providing the first random number generator seed to the receiver 115, except in the case of anomalous events such as emergencies or under legal obligation.

Some embodiments of the sensing matrix Φ are defined as:

$$\Phi = \Gamma \Theta \quad (14)$$

where Θ is the first random matrix and Γ is the second matrix. This configuration allows monitoring while preserving privacy. The receiver 115 has enough information to generate motion scene descriptors that are necessary for performing the monitoring task. However, the receiver 115 cannot reconstruct the original video signal, which would violate the privacy of the monitored area and monitored people 111-114. If, however, an anomaly happens, it may be decided that under the circumstances it is justified to violate the privacy concerns of the people 111-114 in order to get more information. In that case, all that is needed is to provide the receiver 115 with the random number seed for Θ, which gives it the complete definition of Φ and thus allows it to reconstruct the video signal from the compressed video signal. Some embodiments of the receiver 115 are able to extract scene descriptors, such as motion descriptors, from the compressed video signal without knowledge of the first random number generator seed.

In the embodiments described below, Γ and Θ are of sizes M×N and N×N, respectively. Θ is a random transform matrix, hence z, defined by (15) is a random vector of transform coefficients. The second matrix Γ is a selection matrix, which is defined herein to mean that all but one of the entries in each row and each column of F have a value of zero and only one entry in each row has a value of one. Let s (i) be the index of the non-zero entry in the ith row, i= 0, ..., M−1. Then $$y = \Gamma z = [z_{s(0)}, \ldots, z_{s(m-1)}]^T. \quad (16)$$

In other words, the measurements vector is obtained by applying the random transform Θ to the video signal and then selecting the subset of the transform coefficients which corresponds to indices s(0), ..., s(M−1) using the selection matrix Γ. In the illustrated embodiments, the indices s(0), ..., s(M−1) are distinct.

In these embodiments, shifts $\mathcal{T}^n$ in the signal domain can be mapped into corresponding shifts in the measurement domain. For 0≤i<N let $$S_n(i) = \{\mathcal{T}^n(i) | n \in \mathcal{N}\}$$

be the set of all feasible shifts of i. If $\mathcal{A} \subseteq \{0, \ldots, N-1\}$ is a set of indices we define $$\mathcal{J}_\mathcal{N}(\mathcal{A}) = \{i \in \mathcal{A} | S_\mathcal{N}(i) \subseteq \mathcal{A}\} \quad (17)$$

as the set of all indices in $\mathcal{A}$ such that all their feasible shifts are also in $\mathcal{A}$. Let $$\mathcal{M} = \{s(0), \ldots, s(M-1)\} \quad (18)$$

$$\mathcal{M}' = \mathcal{J}_\mathcal{N}(\mathcal{M}) \subseteq \mathcal{M} \quad (19)$$

$$M' = |\mathcal{M}'| \quad (20)$$

where $|\mathcal{M}|$ denotes the number or members in $\mathcal{M}$. Let s'(0), ..., s'(M−1) be the subsequence of s(0), ..., s(M−1) consisting of the indices which are in $\mathcal{M}'$ and define $$y' = [z_{s'(0)}, \ldots, z_{s'(M'-1)}]^T \quad (21)$$

$$\tilde{\mathcal{T}}^n(y') = [z\tilde{\mathcal{T}}^n_{(s'(0))}, \ldots, z\tilde{\mathcal{T}}^n_{(s'(M'-1))}]^T, n \in \mathcal{N} \quad (22)$$

---

Algorithm 1: Choosing s(0), ..., s(M − 1) using a greedy algorithm

1. Receive M, N and $\mathcal{N}$ as arguments
2. Initialize $\mathcal{M} = \phi$ (the empty set)
3. While $|\mathcal{M}| < M$
   3.1. Let $\mathcal{M}' = \mathcal{J}_\mathcal{N}(\mathcal{M})$. We try to add indices into M so that some of the indices in $\mathcal{M} - \mathcal{M}'$ will move into $\mathcal{M}'$. Let C be the set of all indices in $\mathcal{M} - \mathcal{M}'$ for which this is possible:
   $C = \{c \in \mathcal{M} | S_\mathcal{N}(c) \not\subseteq \mathcal{M}, M \geq |\mathcal{M} \cup S_\mathcal{N}(k)|\}$.
   3.2. If C is empty:
      3.2.1. Choose one index k, at random, from $\{0, \ldots, N − 1\} - \mathcal{M}$
      3.2.2. Set $\mathcal{M} := \mathcal{M} \cup \{k\}$
   3.3. Else
      3.3.1. Let $c_{max} = \arg\max_{c \in C} \frac{|\mathcal{J}_\mathcal{N}(\mathcal{M} \cup S_\mathcal{N}(c))|}{|\mathcal{M} \cup S_\mathcal{N}(c)|}$.
      3.3.2. Set $\mathcal{M} := \mathcal{M} \cup S_\mathcal{N}(c_{max})$
4. Let s(0), ..., s(M − 1) be the members of $\mathcal{M}$, sorted in increasing order.

---

By definition, the entries of y' and of $\tilde{\mathcal{T}}^n(y')$, $n \in \mathcal{N}$ are subsets of the entries of y, hence y' and $\tilde{\mathcal{T}}^n(y')$, $n \in \mathcal{N}$ can be computed by the receiver 115, without full knowledge of the first random matrix Θ.

The embodiments mentioned above, in which shifts $\mathcal{T}^n$ in the signal domain can be mapped into corresponding shifts in the measurement domain, typically do not use all the measurements but only the measurements in y' defined in Eq. (21), that is only the transform coefficients whose values are in $\mathcal{M}'$ defined in Eq. (19). The effectiveness of the algorithms described below is improved as M' gets larger. If s(0), ..., s(M−1) are selected completely at random, M' can be quite small or even zero. Therefore, in some embodiments the indices s(0), ..., s(M−1) are chosen to increase M', preferably to a relatively large value. The algorithm below achieves this.

Some of the embodiments described below use the Discrete Fourier Transform (DFT). In the description below the DFT matrix F is defined as:

$$F = [f_{k,l}]_{0 \leq k,l < N}, f_{k,l} = N^{-1/2} \exp(2\pi i k l / N) \quad (23)$$

Hence F is unitary—$F^{-1} = F^*$. In addition, it is assumed that the values of N are even numbers. However, it should be clear to a person skilled in the art that other embodiments can be implemented with different definitions of the DFT or with odd values of N.

A first embodiment of the first random matrix is defined based on a random circulant transform. For example, the first random matrix can be defined as:

$$\Theta = \begin{bmatrix} w(0) & w(N-1) & \ldots & w(1) \\ w(1) & w(0) & \ldots & w(2) \\ \vdots & \vdots & \ddots & \vdots \\ w(N-1) & w(N-1) & \ldots & w(0) \end{bmatrix} \quad (24)$$

where w(0), ... w(N−1) is a sequence of independent, identically-distributed (IID), zero mean, random variables, or a sequence of pseudo-random numbers with the same properties. The receiver 115 can determine motion descriptors from the measurements vector, as discussed in U.S. Patent Application Publication No. 2015/0178945, which is incorporated herein by reference in its entirety. The method described in that patent application does not require knowledge of the values of w(0), ..., w(N−1). Therefore, this operation can be done even when the receiver 115 does not know these values, e.g., because it does not know the first random number generator seed used to generate the values. More specifically, according to the definition of Θ in (24), z=Θx is the convolution of the sequence w(0), ... w(N−1), extended as a periodic sequence of period N, with the sequence $x_0, \ldots, x_{N-1}$. Therefore, $\Theta \mathcal{T}'^n x = \mathcal{T}'^n \Theta x = \mathcal{T}'^n z$. Using the notation of (21) and (22), let $\tilde{\mathcal{G}}(x)$, u, $u^{(n)}$, and dist $(u^{(n)}, u)$ of Eqs. (4)-(7) be defined by $$u = \mathcal{G}(x) = z$$
$$u^{(n)} = \mathcal{G}(\mathcal{T}^n x) = \mathcal{T}^n(z)$$
$$dist(u, u^{(n)}) = \frac{1}{\sqrt{N}} \|u^{(n)} - u\|_2 = \sqrt{\frac{1}{N} \sum_{j=0}^{N-1} (z_{\mathcal{T}^n(j)} - z_j)^2}$$

The values of u, $u^{(n)}$ are not known to the receiver (even if the matrix t is fully known to it). Hence the following approximations according to (9), (10) can be used:

$$\hat{u} = \tilde{\mathcal{G}}(y) = y'$$
$$\hat{u}^{(n)} = \tilde{\mathcal{G}}^n(y) = \tilde{\mathcal{T}}^n(y'), n \in \mathcal{N}$$
$$dist(\hat{u}, \hat{u}^{(n)}) = \frac{1}{\sqrt{M'}} \|\hat{u}^{(n)} - \hat{u}\|_2 = \sqrt{\frac{1}{M'} \sum_{j \in M'} (z_{\mathcal{T}^n(s(j))} - z_{s(j)})^2}$$

Since the entries of y', $\mathcal{T}'^n(y')$ are entries of y, they are known to the receiver 115. Note that $dist^2(u, u^{(n)})$ is the mean of the sequence of random variables $$(z_{\mathcal{T}^n(j)} - z_j)^2,$$

j=0, ..., N−1, while $\overline{dist}^2(\hat{u}, \hat{u}^{(n)})$ is the mean of a sample of size M' from that sequence, hence $\overline{dist}(u, u^{(n)})$ is an approximation to dist $(u, u^{(n)})$ and the rest of the solution follows as described above using Eqs. (12) and (13).

The solution described above uses the fact that the matrix Θ is of the form (24), which is the first matrix template that can be used to generate the first random matrix. However, the receiver 115 can perform the solution without knowledge of the values of w(0), ..., w(N−1) that are used to populate the first matrix template, e.g., without using or without access to the values. Therefore, motion detection can be done with only partial knowledge of the sensing matrix. The quality of the approximation of dist $(u^{(n)}, u)$ by $\overline{dist}(\hat{u}^{(n)}, \vec{u})$ is improved as M' is increased. In order to get a high value of M' for the given M,N,$\mathcal{N}$, some embodiments of the selection matrix Γ are determined using Algorithm 1.

A second embodiment of the first random matrix is defined based on a randomized discrete Fourier transform. In this embodiment, the pixels get their values in an interval which is symmetric about zero, that is, $|x_n| \leq P$ for some constant P. If this is not the case with the original pixels, they can be translated to satisfy this requirement. Let a random matrix be defined as:

$$R = \begin{bmatrix} r_0 & 0 & \cdots & 0 \\ 0 & r_1 & & \vdots \\ \vdots & & \ddots & 0 \\ 0 & \cdots & 0 & r_{N-1} \end{bmatrix} \quad (25)$$

where R is a diagonal random matrix whose diagonal elements, $r_0, \ldots, r_{N-1}$, are IID random variables which get the values {1, −1} with equal probability (e.g., the random variables are Rademacher random variables). Let $$v = Rx.$$

The entries of v get their values in the same interval as the entries of x and they have the same magnitude as the corresponding entries of x, but their signs are toggled randomly. Let V=Fv be the DFT of the random signal v. Since v is real, V is conjugate symmetric and is fully determined by the N real values $$Re\{V_0\}, Re\{V_1\}, Im\{V_1\}, \ldots, Re\{V_{n/2-1}\},$$
$$Re\{V_{n/2-1}\}, Im\{V_{n/2-1}\}$$

Let $$z = [Re\{V_0\}, Re\{V_1\}, Im\{V_1\}, \ldots Re\{V_{n/2-1}\},$$
$$Re\{V_{n/2-1}\}, Im\{V_{n/2-1}\}]^T$$

and let G be the real matrix such that $$z = Gv. \quad (26)$$

The first random matrix can then be defined as:

$$\Theta = GR. \quad (27)$$

Note that this definition makes (26) consistent with (15). In this embodiment, the first random matrix Θ is random because R is random. Therefore, if the key or random number generator seed to R is not supplied to the receiver 115, the receiver 115 cannot reconstruct the video signal from the compressed video signal.

The second matrix Γ is a selection matrix as described above and its operation is defined by Eq. (16). Γ is defined so that it selects complete DFT coefficients: if the real part of a coefficient is selected, the imaginary part is also selected and vice versa. More specifically, $$s(0) = 0$$

If M is even, s(M−1)=N/2
and if 0<s(i)<M, then
If s(i) is odd and i<M−1: s(i+1)=s(i)+1
If s(i) is even and i>0: s(i−1)=s(i)−1
Therefore, some of the entries of V are immediately available from the measurements. Let $\mathcal{K}$ be the set of indices k for which $V_k$ is known from the measurements (including entries derived by the conjugate symmetry $V_k = \overline{V}_{N-k}$). It is easy to verify (separating the cases that M is even or odd) that $|\mathcal{K}| = M+1$. Let u be the video signal whose pixel values are the squares of the pixel values of the original signal x:

$$u = \mathcal{G}(x) = [u_0, \ldots, u_{N-1}]^T, u_j = x_j^2 = v_j^2$$

and accordingly let $u^{(n)}$ be the u shifted by n:

$$u^{(n)} = \mathcal{G}^n(x) = \mathcal{G}(\mathcal{T}'^n x) = \mathcal{T}'^n u$$

The squaring causes a distortion in the intensity of the video signal, but it does not change the spatial relationships among objects and motion appears in the signal u in the same way that it appears in the original signal x. Let U=Fu be the Fourier transform of u. Then by the well-known properties of the DFT:

$$(F\mathcal{T}'^n u)_k = \exp(-2\pi i n k/N) U_k, k = 0, \ldots, N-1$$

The $L^2$ distance is used to determine a dissimilarity measure, hence the object of minimization in (6) and (7) becomes:

$$dist^2(u^{(n)}, u) = \|u^{(n)} - u\|_2^2 = \qquad (28)$$

$$\|\mathcal{T}^n u - u\|_2^2 = \sum_{l=0}^{N-1} |U_l(\exp(2\pi i n l/N) - 1)|^2 = \sum_{l=1}^{N-1} h_l |U_l|^2$$

$$h_l = \begin{cases} 8\sin^2(nl\pi/N) & 0 < l < N/2 \\ 4\sin^2(n\pi/2) & l = N/2 \end{cases} \qquad (29)$$

In the video signals produced by monitoring of real scenes, e.g., monitoring of the region 110 by the camera 105, most of the energy is concentrated at the low frequencies. Let $\mathcal{L} \subseteq \{1, \ldots, N\}$ be the set of indices which correspond to low frequencies (since the signal is 3-dimensional, these indices are usually not consecutive). The DFT of the product of two signals is the convolution of their DFTs (scaled by $N^{-1/2}$), therefore:

$$U_l = \qquad (30)$$

$$N^{-1/2} \sum_{k=0}^{N-1} V_k V_{(l-k)_N} = N^{-1/2} \sum_{k=0}^{N-1} V_k \overline{V}_{(k-l)_N} = N^{1/2} \left( \frac{1}{N} \sum_{k=0}^{N-1} V_{\mathcal{T}^{(l)}(k)} \overline{V}_k \right).$$

Using the definition in equation (17), let $\mathcal{K}' = \mathcal{J}_{\mathcal{L}}(\mathcal{K})$. Thus, if $k \in \mathcal{K}' \subseteq \mathcal{K}$ then $\mathcal{T}^{-l}(k) \in \mathcal{K}$ for any $l \in \mathcal{L}$. The expression in parenthesis on the right hand side of (30) is the mean of the identically distributed random variables $V_{\mathcal{T}^{(l)}(k)} \overline{V}_k$, $0 \le k < N$, which can be estimated by the mean of a sample of those random variables:

$$\hat{U}_l = \frac{N^{1/2}}{|\mathcal{K}'|} \sum_{k \in \mathcal{K}'} V_{\mathcal{T}^{(l)}(k)} \overline{V}_k \approx U_l, \quad l \in \mathcal{L} \qquad (31)$$

Substituting these approximations in (28) produces:

$$\|u^{(n)} - u\|_2^2 \approx \sum_{l \in \mathcal{L}} h_l |\hat{U}_l|^2 \qquad (32)$$

where h(l), $l \in \mathcal{L}$ are deterministic values defined by (29), and therefore known to the receiver 115. Let s'(0), ..., s'($|\mathcal{K}'|-1$) be the indices in $\mathcal{K}'$ in increasing order. Define $$\hat{u} = \tilde{\mathcal{G}}(y) = [V_{s'(0)}, \ldots, V_{s'(|\mathcal{K}'|-1)}]^T \qquad (33)$$

$$\hat{u}^{(n)} = \tilde{\mathcal{G}}^n(y) = [V_{\mathcal{T}^n(s'(0))}, \ldots, V_{\mathcal{T}^n(s'(|\mathcal{K}'|-1))}]^T \qquad (34)$$

By definition, $\hat{u}$ and $\hat{u}^{(n)}$, $n \in \mathcal{N}$ can be derived from y because their entries are composed from entries of y. By substituting the left hand side of (31) into the right hand side of (32) one defines:

$$dist^2(\hat{u}^{(n)}, \hat{u}) = \frac{N}{|\mathcal{K}'|^2} \sum_{l \in \mathcal{L}} h_l \left| \sum_{k=0}^{|\mathcal{K}'|-1} V_{\mathcal{T}^{(l)}(s'(k))} \overline{V}_{s'(k)} \right|^2 = \qquad (35)$$

$$\frac{N}{|\mathcal{K}'|^2} \sum_{l \in \mathcal{L}} h_l \langle \hat{u}^T, \hat{u}^{(l)} \rangle \approx dist^2(u^{(n)}, u)$$

By using definitions (33)(35) in the minimization problem of equations (9), (10), the receiver 115 can assess if there is motion in the scene represented in the compressed video signal, and if there is, a direction and a speed of the motion can be estimated.

In order for the approximation in (31) to work well, the set of indices $\mathcal{K}'$ should be as large as possible. In order to achieve this, some embodiments of the receiver 115 or other entity can select s(0), ..., s(M−1), or equivalently, the entries in $\mathcal{K}$, using Algorithm 1, with $\mathcal{L}$ taking the role of $\mathcal{N}$. There is a trade-off between the size of $\mathcal{L}$ and the size of $\mathcal{K}'$: the larger $\mathcal{L}$ is, the better the approximation. However, as $\mathcal{L}$ becomes larger $\mathcal{K}'$ becomes smaller, because each additional element in $\mathcal{L}$ imposes additional constraints on $\mathcal{K}' = \mathcal{J}_{\mathcal{L}}(\mathcal{K})$, and therefore the approximation (31) becomes worse.

It is clear from Eqs. (33)(35) that the receiver can compute $\mathcal{T}$ ist($\hat{u}^{(n)}, \hat{u}$), and therefore, produce estimated motion descriptors, even if the receiver does not have the random number generator seed which allows it to generate the random sequence $r_0, \ldots, r_{N-1}$. However, the receiver 115 can reconstruct the video signal from the measurements if, and only if, it has the random number generator seed which allows it to generate $r_0, \ldots, r_{N-1}$.

A third embodiment of the first random matrix is defined based on a random convolution transform. For example, the first random matrix $\Theta$ is given by:

$$\Theta = F^{-1} R F \qquad (36)$$

where F is the DFT matrix given by (23) and R is a random diagonal matrix of the form (25), but with a different definition of the diagonal elements. The diagonal elements $r_0, \ldots, r_{N-1}$ here are defined as follows:

$r_0, \ldots, r_{N/2}$ are independent random variables.

$r_0$ and $r_{N/2}$ get the values $\{1, -1\}$ with equal probability (Rademacher random variables).

$r_1, \ldots, r_{N/2-1}$ are uniformly distributed on the complex unit circle, that is $$r_k = \exp(i\varphi_k), k = 1, \ldots, N/2-1$$

where $\varphi_k$ is uniformly distributed on $[0, 2\pi)$.

For $N/2 < k < N$, $r_k = \overline{r}_{N-k}$

The definition (36) involves complex matrices. Nevertheless, because the sequence $r_0, \ldots, r_{N-1}$ is conjugate symmetric, the matrix $\Theta$ is real. Let $u = \mathcal{G}(x) = x$, $u^{(n)} = \mathcal{G}^n(x) = \mathcal{T}^n x$ and define $$\rho(n) = u^T u^{(n)} = \sum_{j=0}^{N-1} x_j x_{(j+k)_N}, \quad 0 \le n \le N - 1$$

$$dist(u^{(n)}, u) = 1 - \|u\|_2^2 = u^T u^{(n)} = 1 - \frac{\rho(n)}{\rho(0)}, \quad n \in \mathcal{N}$$

$\rho(n)$ is the circular autocorrelation of the signal x and the distance dist ($u^{(n)}, u$) gets values between zero and one, with low values when the correlation coefficient between x and $\mathcal{T}^n$x is high, which makes it a reasonable dissimilarity measure.

Let z be defined by (26). It has been shown (in Theorem 2 of R. Haimi-Cohen and Y. M. Lai, "Compressive measurements generated by structurally random matrices: Asymptotic normality and quantization", *Signal Processing* 120, pp. 71-87, 2016, which is incorporated herein by reference in its entirety) that $$\rho(n) = NE\{z_j z_{(j+n)_N}\}, \quad 0 \le n, j < N \tag{37}$$

Therefore, the value of $\rho(n)$ can be estimated by replacing the expectation on the right hand side of (37) by averaging several terms of the form $$z_j z_{(j+n)_N}.$$

Let $\mathcal{M}$, $\mathcal{M}'$, M' be defined by (18)-(20) and let s'(0), ..., s'(M'-1) be the subsequence of s(0), ..., s(M-1) consisting of the indices which are in $\mathcal{M}'$. Define $$\hat{u} = \tilde{\mathcal{G}}(y) = [z_{s'(0)}, \ldots, z_{s'(M-1)}]^T \tag{38}$$

$$\hat{u}^{(n)} = \tilde{\mathcal{G}}^n(y) = [z_{\mathcal{T}^n(s'(0))}, \ldots, z_{\mathcal{T}^n(s'(M-1))}]^T, \quad n \in \mathcal{N} \tag{39}$$

Clearly $\hat{u}$, $\hat{u}^{(n)}$, $n \in \mathcal{N}$ can be computed from y because by definition, their entries are subsets of the entries of y, and this computation does not require knowledge of the random sequence $r_0, \ldots, r_{N-1}$. Then $$\rho(0) \approx \frac{N}{M'} \sum_{j=0}^{M'-1} z_{s'(j)}^2 = \frac{N}{M'} \|\hat{u}\|_2^2 \tag{40}$$

$$\rho(n) \approx \frac{N}{M'} \sum_{j=0}^{M'-1} z_{s'(j)} z_{\mathcal{T}^n(s'(j))} = \frac{N}{M'} \hat{u}^T \hat{u}^{(n)}, \quad n \in \mathcal{N} \tag{41}$$

Accordingly, the value of dist ($u^{(n)}$,u) can be approximated by:

$$\mathcal{T}\text{ist}(\hat{u}^{(n)},\hat{u}) = 1 - \|\hat{u}\|_2^{-2}(\vec{u}^T \hat{u}^{(n)}) \approx \text{dist}(u^{(n)},u), n \in \mathcal{N}. \tag{42}$$

By using definitions (38), (39), (42) in the minimization problem of equations (9), (10), one can assess if there is motion in the compressed video signal, and if there is, a direction and a speed of the motion can be estimated. Clearly, this does not require knowledge of R, hence motion detection can be performed without complete knowledge of Θ, e.g., without use of or access to the first random number generator seed used to populate the first matrix template to generate the first random matrix. The quality of the approximations (40), (41) is improved as M' is increased. In order to get a high value of M' for the given M,N, $\mathcal{N}$ the selection matrix Γ is constructed using Algorithm 1, which results in the selection matrix as in the first embodiment discussed above.

Figure 2:
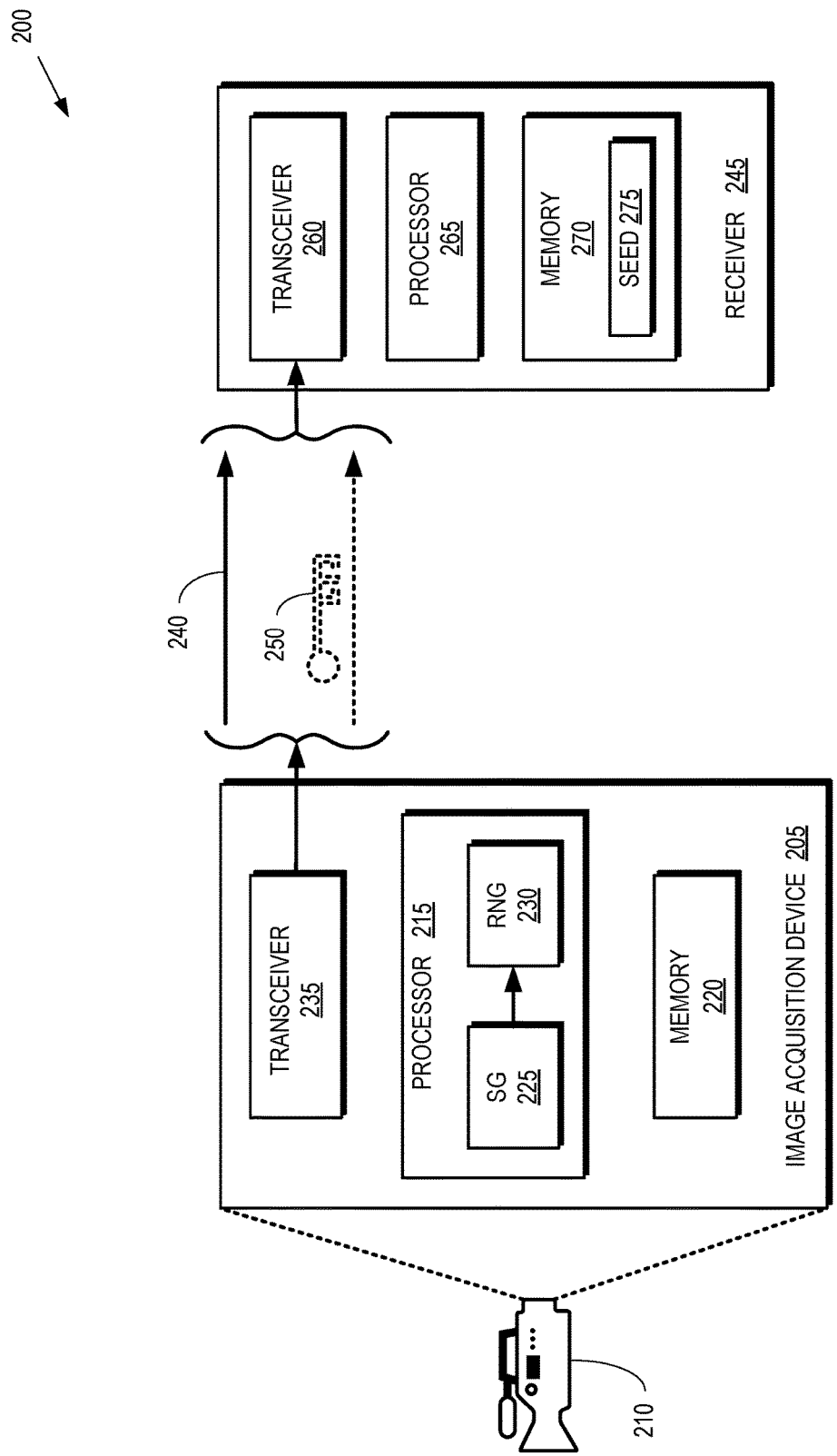
FIG. 2 is a diagram of a second example of an image acquisition system according to some embodiments.

FIG. 2 is a diagram of a second example of an image acquisition system 200 according to some embodiments. The image acquisition system 200 is used to implement some embodiments of the image acquisition system 100 shown in FIG. 1. The image acquisition system 200 includes an image acquisition device 205 that is used to acquire and process video signals, e.g., using a camera 210. The image acquisition device 205 performs compressive sensing on the acquired video signals to generate compressed video signals based on a sensing matrix that is equal to the product of a first random matrix and a second matrix. In some embodiments, the first random matrix is a random selection matrix and the second matrix is a transform matrix, while in other embodiments the first random matrix is a random transform matrix and the second matrix is a selection matrix as discussed herein. The first random matrix is generated based on a first matrix template and a first random number generator seed.

The image acquisition device 205 includes a processor 215 and a memory 220. The processor 215 can be used to execute instructions stored in the memory 220 and to store information in the memory 220 such as the results of the executed instructions. Some embodiments of the processor 215 implement a seed generator (SG) 225 that generates random number generator seeds such as the first random number generator seed that is used to generate the first random matrix. The processor 215 also implements a random number generator (RNG) 230 that receives the random number generator seeds from the seed generator 225 and uses the random number generator seeds to generate corresponding random numbers. For example, the random number generator 230 is able to generate a first sequence of random numbers that is used to populate the first matrix template to form the random transform matrix.

The image acquisition device 205 also includes a transceiver 235 that is configured to transmit or receive signals according to wired or wireless communication standards. The transceiver 235 can be implemented as a single integrated circuit (e.g., using a single ASIC or FPGA) or as a system-on-a-chip (SOC) that includes different modules for implementing the functionality of the transceiver 235. The transceiver 235 is configured to transmit the compressed video signal 240 to a receiver 245. The transceiver 235 is also configured to selectively transmit the first random number generator seed 250 to the receiver 245. In normal operation, the transceiver 235 does not transmit the first random number generator seed 250 to the receiver 245 so that the receiver 245 is not able to generate the first sequence of random numbers to populate the first matrix template and form the random transform matrix. Thus, the receiver 245 is not able to reconstruct the original video signal from the compressed video signal 240. In some anomalous situations, such as an emergency or under legal obligation, the transceiver 235 transmit the first random number generator seed 250 to the receiver 245 so that the receiver 245 is able to generate the first sequence of random numbers that are used to reconstruct the original video signal from the compressed video signal 240. In some embodiments, the transceiver 235 transmits the first random number generator seed 250 in encrypted form. The corresponding encryption keys can then be selectively provided to the receiver 245 to enable decrypting of the encrypted random number generator seeds 250.

The receiver 245 includes a transceiver 260 that is configured to transmit or receive signals according to wired or wireless communication standards. The transceiver 260 can be implemented as a single integrated circuit (e.g., using a single ASIC or FPGA) or as a system-on-a-chip (SOC) that includes different modules for implementing the functionality of the transceiver 260. The receiver 245 also includes a processor 265 and a memory 270. The processor 265 can be used to execute instructions stored in the memory 270 and to store information in the memory 270 such as the results of the executed instructions. Some embodiments of the processor 265 are configured to extract scene descriptors from the compressed video signal 240. The processor 265 is also configured to reconstruct the video signal from the compressed video signal on the basis of the first random number generator seed 250 under anomalous conditions, as discussed herein. The memory 270 is able to store copies 275 of the first random number generator seed 250. As discussed herein, the copies 275 can be stored in encrypted form.

Figure 3:
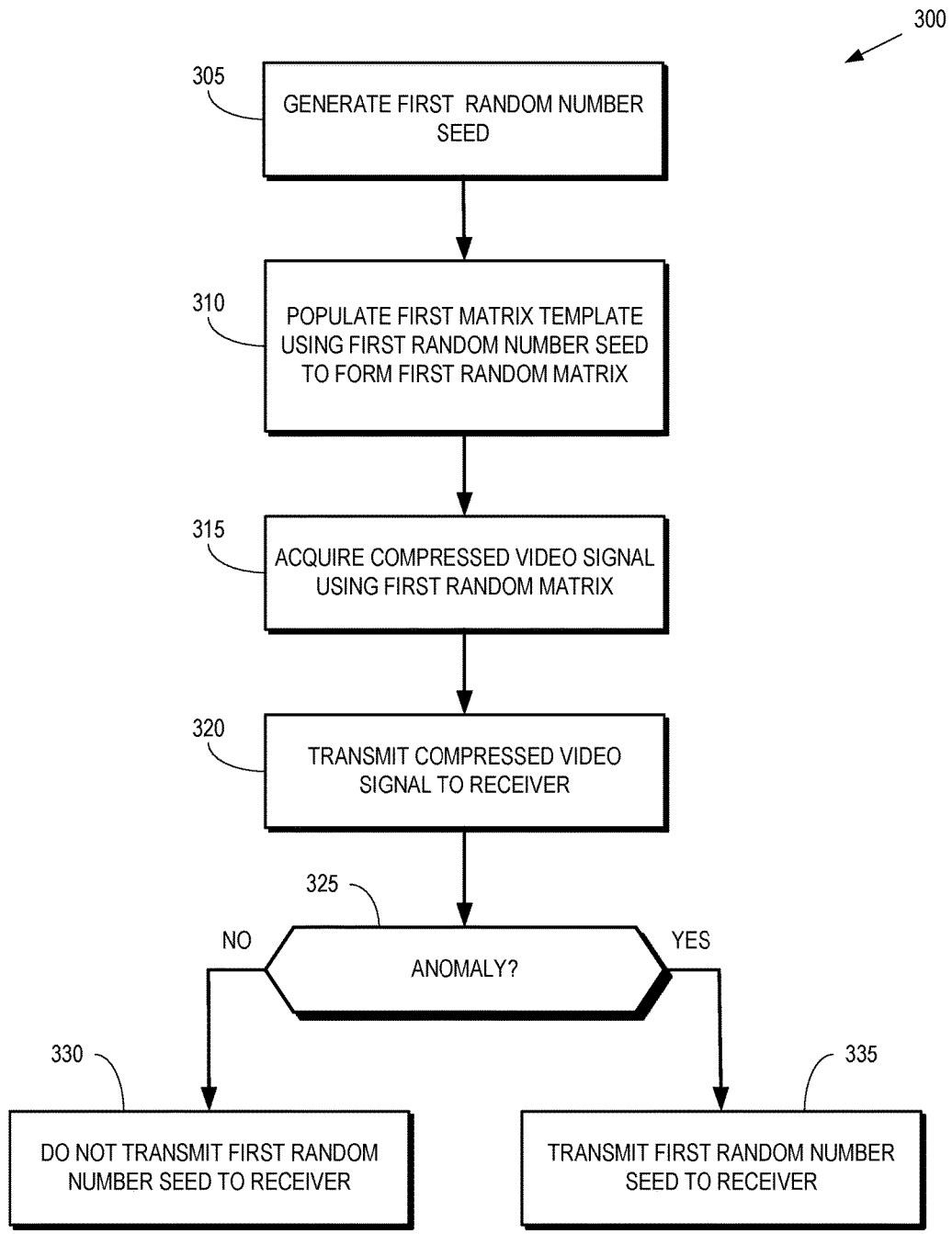
FIG. 3 is a flow diagram of a method for selectively transmitting a random number seed from an image acquisition device to a receiver according to some embodiments.

FIG. 3 is a flow diagram of a method 300 for selectively transmitting a random number generator seed from an image acquisition device to a receiver according to some embodiments. The method 300 is implemented in some embodiments of the image acquisition system 100 shown in FIG. 1 and the image acquisition system 200 shown in FIG. 2. An image acquisition device (such as a video camera) acquires a video signal and uses compressive sensing to form a compressed video signal on the basis of a sensing matrix, as discussed herein. In the illustrated embodiment, the sensing matrix is formed from a first random matrix and a second random matrix, where the first random matrix is formed using a corresponding first matrix templates that is populated on the basis of a corresponding first random number generator seed that is generated by the image acquisition device.

At block 305, the image acquisition device generates first random number generator seed. For example, the image acquisition device can generate the first random number generator seed using a seed generator such as the seed generator 225 shown in FIG. 2. At block 310, the image acquisition device populates first matrix template using the sequence of random numbers that is generated based on the first random number generator seed to form the first random matrix. For example, the image acquisition device can generate the sequence of random numbers using a random number generator such as the random number generator 230 shown in FIG. 2.

At block 315, the image acquisition device acquires a compressed video signal by performing compressive sensing on a video signal on the basis of the sensing matrix. At block 320, the image acquisition device transmits the compressed video signal to a receiver. As discussed herein, the receiver is able to extract scene descriptors, such as motion descriptors or object descriptors, from the compressed video signal. However, without knowledge of the first random number generator seed, e.g., without using or without access to the first random number generator seed, the receiver is not able to reconstruct the video signal from the compressed video signal.

At decision block 325, an anomaly condition can be detected that would require the image acquisition device to provide the first random number generator seed to the receiver. For example, the image acquisition device can be required to transmit the first random number generator seed to the receiver in the event of an emergency or under legal obligation. In some embodiments, the receiver determines, based on the extracted scene descriptors, if there is an anomaly, and in that case the receiver declares an emergency that causes the image acquisition device to provide the first random number generator seed to the receiver. Under normal operating conditions the image acquisition device bypasses the transmission of the first random number generator seed to the receiver (at block 330). If the image acquisition device determines that there is a need for it, the image acquisition device transmits the first random number generator seed to the receiver (at block 335). Thus, in the event of an anomaly, the receiver acquires the first random number generator seed, which enables the receiver to reconstruct the video signal from the compressed video signal.

Figure 4:
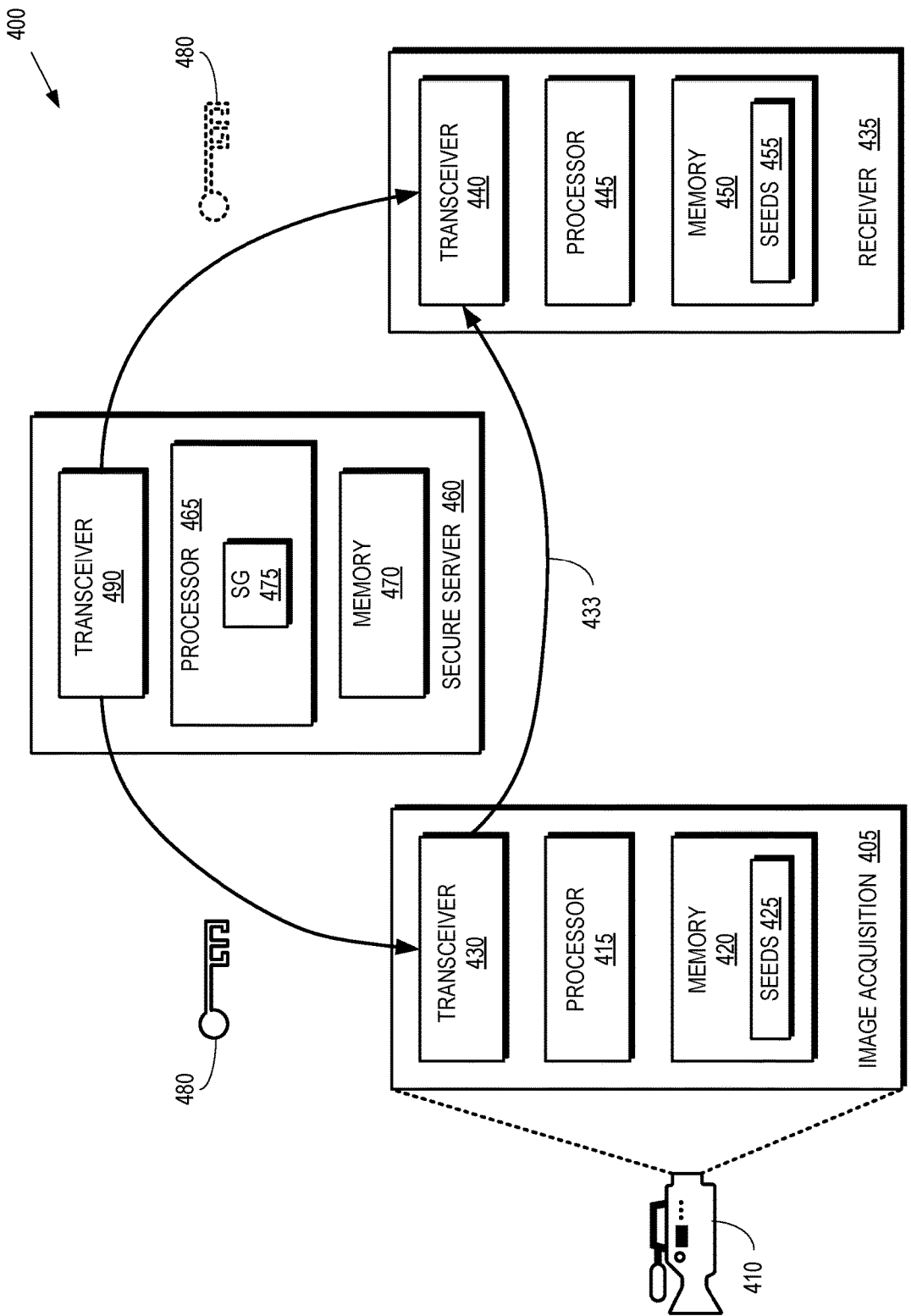
FIG. 4 is a diagram of a third example of an image acquisition system according to some embodiments.

FIG. 4 is a diagram of a third example of an image acquisition system 400 according to some embodiments. The image acquisition system 400 is used to implement some embodiments of the image acquisition system 100 shown in FIG. 1. The image acquisition system 400 includes an image acquisition device 405 that is used to acquire and process video signals, e.g., using a camera 410. The image acquisition device 405 performs compressive sensing on the acquired video signals to generate compressed video signals based on a sensing matrix that is equal to the product of a first random matrix and a second matrix, as discussed herein. The first random matrix is generated based on a first matrix template and a first random number generator seed.

The image acquisition device 405 includes a processor 415 and a memory 420. The processor 415 can be used to execute instructions stored in the memory 420 and to store information in the memory 420 such as the results of the executed instructions. The memory 420 includes a portion 425 that is configured to store random number generator seeds. The processor 415 can therefore access the random number generator seed stored in the portion 425 and generate sequences of random numbers, e.g. using a random number generator (not shown in the interest of clarity). The processor 415 can therefore use the stored random number generator seeds to generate random matrices, as discussed herein. The image acquisition device 405 also includes a transceiver 430 that is configured to transmit or receive signals according to wired or wireless communication standards. The transceiver 430 can be implemented as a single integrated circuit (e.g., using a single ASIC or FPGA) or as a system-on-a-chip (SOC) that includes different modules for implementing the functionality of the transceiver 430. The transceiver 430 is configured to transmit the compressed video signal 433 to a receiver 435.

The receiver includes a transceiver 440 that is configured to transmit or receive signals according to wired or wireless communication standards. For example, the transceiver 440 can receive the compressed video signal 433 from the image acquisition device 405. The transceiver 440 can be implemented as a single integrated circuit (e.g., using a single ASIC or FPGA) or as a system-on-a-chip (SOC) that includes different modules for implementing the functionality of the transceiver 440. The receiver 435 also includes a processor 445 and a memory 450. The processor 445 can be used to execute instructions stored in the memory 450 and to store information in the memory 450 such as the results of the executed instructions. The memory 450 includes a portion 455 that is configured to store random number generator seeds. The processor 445 can therefore access the random number generator seed stored in the portion 455 and generate a sequence of random numbers, e.g. using a random number generator (not shown in the interest of clarity). The processor 445 can therefore extract scene descriptors from compressed video signals and, if the processor 445 is able to generate the first random sequence, it can reconstruct an estimate of the original video signal from the compressed video signal.

The image acquisition system 400 also includes a secure server 460 for generating and providing random number generator seeds. The secure server 460 includes a processor 465 and a memory 470. The processor 465 can be used to execute instructions stored in the memory 470 and to store information in the memory 470 such as the results of the executed instructions. Some embodiments of the processor 465 implement a seed generator (SG) 475 that generates random number generator seeds such as a first random number generator seed 480 that is used to generate the first random matrix.

The secure server 460 also includes a transceiver 490 that is configured to transmit or receive signals according to wired or wireless communication standards. The transceiver 490 can be implemented as a single integrated circuit (e.g., using a single ASIC or FPGA) or as a system-on-a-chip (SOC) that includes different modules for implementing the functionality of the transceiver 490. The transceiver 490 is configured to transmit the first random number generator seed 480 to the image acquisition device 405 so that the image acquisition device 405 can generate the sensing matrix needed to perform compressive sensing on the video signal provided by the camera 410. The transceiver 490 is also configured selectively transmit the first random number generator seed 480 to the receiver 435. Some embodiments of the transceiver 490 are configured to transmit the first random number generator seed 480 in encrypted form based on different encryption keys. The transceiver 490 can then selectively transmit the encryption keys for the first random number generator seed 480 to the receiver 435, which can use the received encryption keys to decrypt the encrypted random number generator seed 480.

In normal operation, the transceiver 490 does not transmit the first random number generator seed 480 to the receiver 435 so that the receiver 435 is not able to generate the first sequence of random numbers to populate the first matrix template and form the random transform matrix. Thus, the receiver 435 is not able to reconstruct the original video signal from the compressed video signal 433 provided by the image acquisition device 405. In some anomalous situations, such as an emergency or under legal obligation, the transceiver 490 transmits the first random number generator seed 480 to the receiver 435 so that the receiver 435 is able to generate the first sequence of random numbers that are used to reconstruct the original video signal from the compressed video signal 433.

Figure 5:
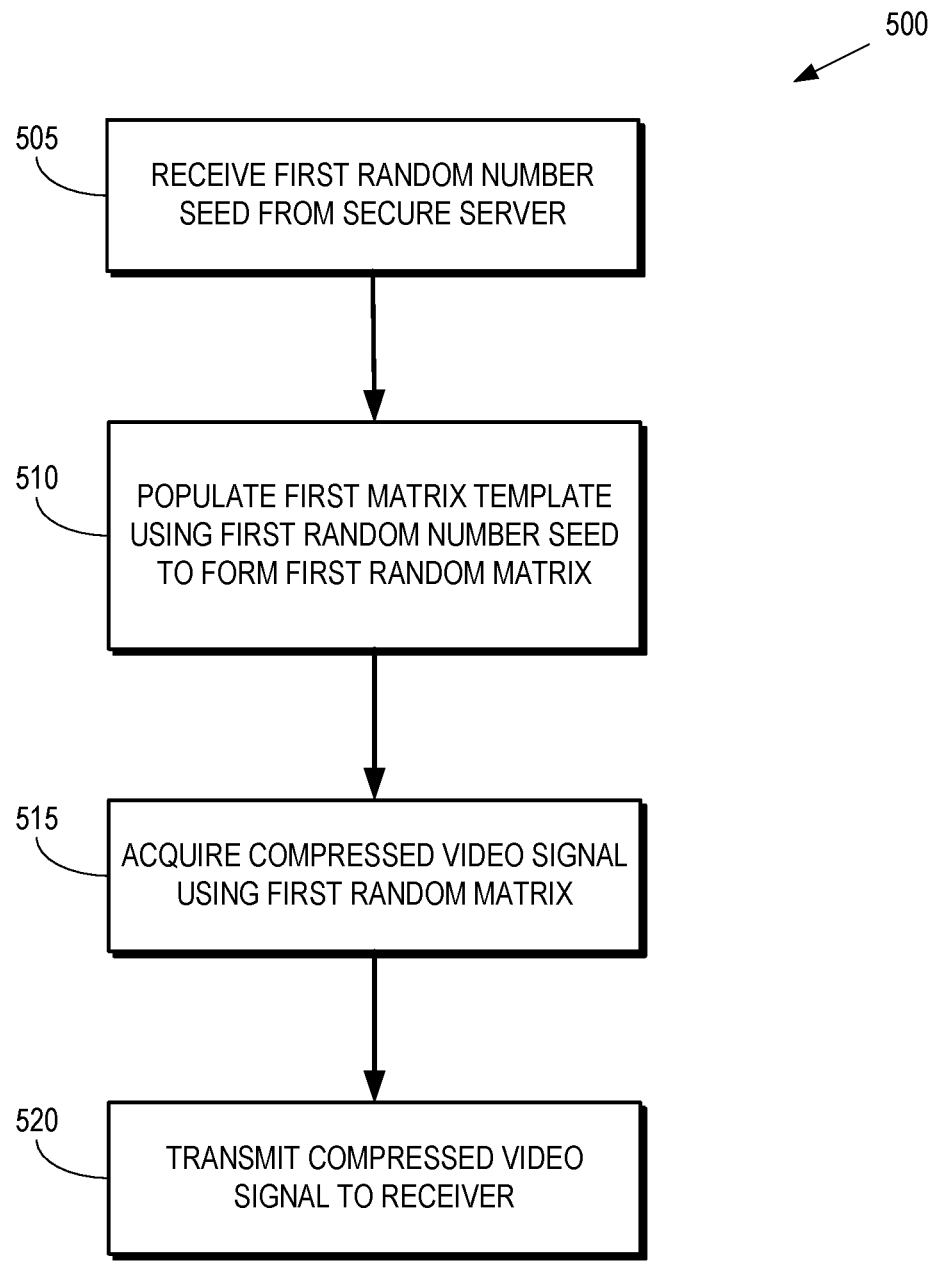
FIG. 5 is a flow diagram of a method for acquiring a compressed video signal using compressive sensing and providing the compressed video signal to a receiver according to some embodiments.

FIG. 5 is a flow diagram of a method 500 for acquiring a compressed video signal using compressive sensing and providing the compressed video signal to a receiver according to some embodiments. The method 500 is implemented in some embodiments of the image acquisition system 100 shown in FIG. 1 and the image acquisition system 400 shown in FIG. 4. An image acquisition device (such as a video camera) acquires a video signal and uses compressive sensing to form a compressed video signal on the basis of a sensing matrix, as discussed herein. In the illustrated embodiment, the sensing matrix is formed from a first random matrix and a second matrix, which are formed using corresponding a first matrix template that is populated on the basis of corresponding first random number generator seed that the generated by the image acquisition device. However, as discussed above, the first random number generator seed may be generated by a secure server and transmitted to the image acquisition device.

At step 505, the image acquisition device receives first random number generator seed, from a secure server. For example, the image acquisition device can transmit a request to a secure server such as the secure server 460 shown in FIG. 4 and the secure server can transmit the first random number generator seed to the image acquisition device. At step 510, the image acquisition device populates first matrix template using the first sequence of random numbers that are generated based on the first random number generator seeds to form the first random matrices. The first random matrix and second matrix are then combined to form the sensing matrix. At block 515, the image acquisition device acquires a compressed video signal by performing compressive sensing on a video signal on the basis of the sensing matrix. At block 520, the image acquisition device transmits the compressed video signal to a receiver.

Figure 6:
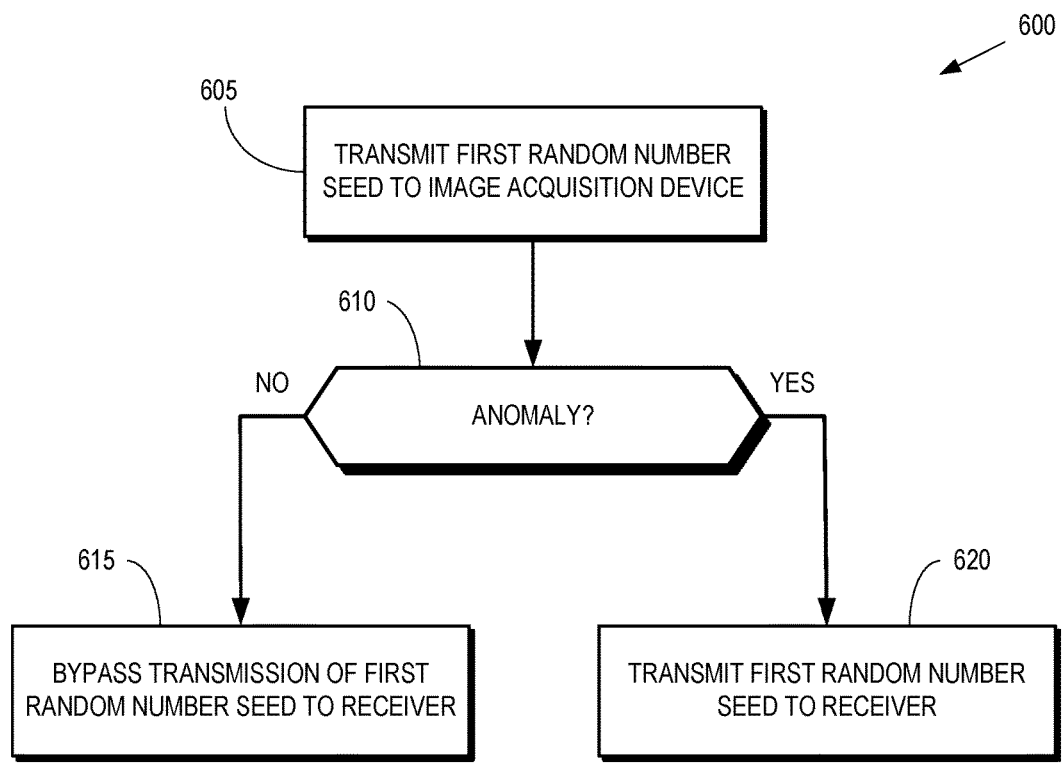
FIG. 6 is a flow diagram of a method for selectively transmitting random number seeds from a secure server to a receiver according to some embodiments.

FIG. 6 is a flow diagram of a method 600 for selectively transmitting random number generator seeds from a secure server to a receiver according to some embodiments. The method 600 is implemented in some embodiments of the image compression system 100 shown in FIG. 1 in the secure server 460 shown in FIG. 4. The secure server includes a random seed generator such as the random seed generator 475 shown in FIG. 4, which is used to generate first random number generator seeds. The first random number generator seed is used to generate a first random, as discussed herein.

At step 605, the secure server transmits the first random number generator seed to an image acquisition device such as the image acquisition device 105 shown in FIG. 1 and image acquisition device 405 shown in FIG. 4. For example, the secure server can receive a request for the first random number generator seeds from the image acquisition device and then provide the first random number generator seeds to the image acquisition device.

At decision step 610, the secure server determines whether there is an anomaly that requires that a receiver reconstruct the video signal from the compressed video signal. As discussed herein, the anomaly can be an emergency or a legal obligation. Under normal operating conditions, no anomaly exists and the first random number generator seed is not transmitted to the receiver. For example, an image acquisition device or a secure server can bypass (at block 615) transmission of the first random number generator seed to the receiver as long as no anomaly is detected. If an anomaly exists, the secure server transmits (at block 620) the first random number generator seed to the receiver, which enables the receiver to reconstruct the video signal from the compressed video signal.

Figure 7:
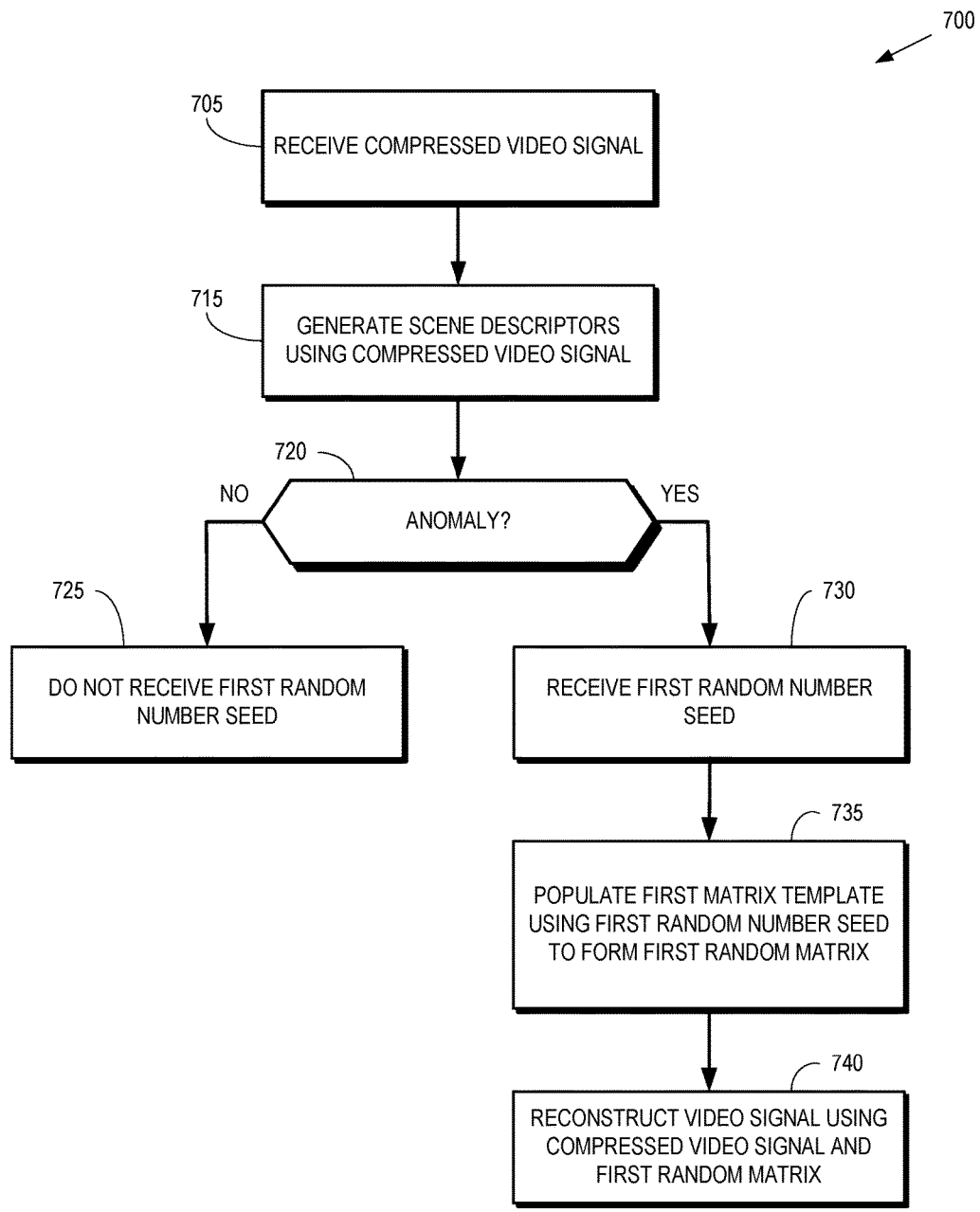
FIG. 7 is a flow diagram of a method for selectively receiving random number seeds and reconstructing a video signal from a compressed video signal according to some embodiments.

FIG. 7 is a flow diagram of a method 700 for selectively receiving random number generator seeds and reconstructing a video signal from a compressed video signal according to some embodiments. The method 700 is implemented in some embodiments of the receiver 115 shown in FIG. 1, the receiver 245 shown in FIG. 2, and the receiver 435 shown in FIG. 4. An image acquisition device (such as a video camera) acquires a video signal and uses compressive sensing to form a compressed video signal on the basis of a sensing matrix, as discussed herein. In the illustrated embodiment, the sensing matrix is formed from a first random matrix, which is formed using corresponding first matrix template that is populated on the basis of corresponding first random number generator seed, that is generated by the image acquisition device or received from a secure server, and a second matrix.

At step 705, the receiver receives the compressed video signal from the image acquisition device. At step 715, the receiver generates one or more scene descriptors from the compressed video signal using the second random matrix. For example, as discussed herein, the receiver can generate one or more motion descriptors from the compressed video signal using the second matrix and a knowledge of the structure of the first random matrix. However, the receiver does not need the first random number generator seed to extract the motion descriptors from the compressed video signal.

At step 720, the receiver determines whether there is an anomaly such as an emergency or a legal obligation that requires reconstruction of the video signal from the compressed video signal. In some embodiments, the receiver uses the motion descriptors generated at block 715 to determine whether an anomaly exists. For example, the motion descriptors may indicate unusual, suspicious, or dangerous motion within a region being monitored to produce the compressed video signal. Under normal circumstances, the receiver does not detect an anomaly and so the receiver does not receive the first random number generator seed from the image acquisition device or the secure server (at block 725). If the receiver detects an anomaly, the method 700 flows to step 730.

At step 730, the receiver receives the first random number generator seed, e.g., from the image acquisition device or the secure server. At step 735, the receiver populates the first matrix template using the first random number generator seed to form the first random matrix. For example, the receiver can generate a sequence of random numbers to populate the entries in the first matrix template using the first random number generator seed. At step 740, the receiver reconstructs the video signal from the compressed video signal using the first random matrix, as discussed herein.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
   compressing, at an image acquisition device, a media signal representative of a scene based on a sensing matrix that is a determined by a sensing matrix template and a set of template parameters;
   providing, from the image acquisition device, the compressed media signal to a receiver; and
   selectively providing a specification of a subset of the set of template parameters to the receiver so that the media signal cannot be reconstructed from the provided compressed media signal using the provided specification of the subset of the set of template parameters.

2. The method of claim 1, wherein the media signal is a video signal.

3. The method of claim 1, wherein the sensing matrix template comprises at least one matrix template, and wherein said at least one matrix template is determined by parameters from the set of template parameters.

4. The method of claim 3, wherein the set of template parameters comprises at least one random number generator seed, and wherein selectively providing the specification comprises selectively providing a subset of the set of template parameters that does not include the random number generator seed.

5. The method of claim 3, wherein:
   the at least one matrix template comprises a first random matrix and a second matrix;
   the set of template parameters comprises a random number generator seed;
   the first random matrix is determined by a sequence of parameters generated by a random number generator using the random number generator seed; and
   the sensing matrix is the product of the first random matrix and the second matrix.

6. The method of claim 5, further comprising:
determining the first random matrix based on at least one of a random circulant transform, a locally randomized discrete Fourier transform, or a random convolution transform.

7. The method of claim 1, further comprising:
providing a first random number seed in addition to the subset of the set of template parameters in response to detection of an anomaly that requires reconstruction of the compressed media signal.

8. The method of claim 1, wherein a specification of the set of template parameters is provided in response to detecting an anomaly that indicates that the receiver is required to reconstruct the media signal from the compressed media signal.

9. A method comprising:
compressing, at an image acquisition device, a media signal representative of a scene based on a sensing matrix that is a determined by a sensing matrix template and a set of template parameters that includes a random number seed;
providing, from the image acquisition device, the compressed media signal to a receiver; and
selectively providing a specification of a subset of the set of template parameters to the receiver, wherein the subset does not include the random number seed so that the media signal cannot be reconstructed from the provided compressed media signal using the provided specification of the subset of the set of template parameters.

10. The method of claim 9, wherein the media signal is a video signal.

11. The method of claim 9, wherein the sensing matrix template comprises at least one matrix template, and wherein said at least one matrix template is determined by parameters from the set of template parameters.

12. The method of claim 11, wherein:
the at least one matrix template comprises a first random matrix and a second matrix;
the set of template parameters comprises a random number generator seed;
the first random matrix is determined by a sequence of parameters generated by a random number generator using the random number generator seed; and
the sensing matrix is the product of the first random matrix and the second matrix.

13. The method of claim 12, further comprising:
determining the first random matrix based on at least one of a random circulant transform, a locally randomized discrete Fourier transform, or a random convolution transform.

14. The method of claim 13, further comprising:
providing the random number generator seed to the receiver in response to detection of an anomaly that requires reconstruction of the compressed media signal.

* * * * *